(12) United States Patent
Sakai et al.

(10) Patent No.: US 12,207,400 B2
(45) Date of Patent: Jan. 21, 2025

(54) METAL COMPONENT AND CERAMIC SUBSTRATE

(71) Applicant: SHINKO ELECTRIC INDUSTRIES CO., LTD., Nagano (JP)

(72) Inventors: Ayako Sakai, Nagano (JP); Yuichi Nakamura, Nagano (JP); Keita Sato, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 184 days.

(21) Appl. No.: 17/977,237

(22) Filed: Oct. 31, 2022

(65) Prior Publication Data

US 2023/0134940 A1    May 4, 2023

(30) Foreign Application Priority Data

Nov. 4, 2021    (JP) .................. 2021-180087

(51) Int. Cl.
*H05K 1/03*    (2006.01)
*H05K 1/18*    (2006.01)

(52) U.S. Cl.
CPC .......... *H05K 1/0306* (2013.01); *H05K 1/181* (2013.01); *H05K 2201/10242* (2013.01); *H05K 2201/10628* (2013.01)

(58) Field of Classification Search
CPC .............. H05K 1/0306; H05K 1/181; H05K 2201/10242; H05K 2201/10628
USPC .......................................... 174/250
See application file for complete search history.

(56) References Cited

U.S. PATENT DOCUMENTS

| 3,392,052 | A | * | 7/1968 | Davis ................... H05K 3/0044 |
| | | | | 156/154 |
| 4,374,457 | A | * | 2/1983 | Wiech, Jr. .............. H05K 3/101 |
| | | | | 257/E23.101 |
| 4,681,656 | A | * | 7/1987 | Byrum .................. C04B 41/009 |
| | | | | 156/89.18 |
| 5,819,858 | A | * | 10/1998 | Nechansky ......... H01L 21/4857 |
| | | | | 174/250 |
| 11,191,162 | B2 | * | 11/2021 | Watanabe ............... H01L 25/13 |
| 11,712,745 | B2 | * | 8/2023 | Parker ................. H01L 21/6831 |
| | | | | 228/121 |
| 2007/0028834 | A1 | * | 2/2007 | Awazu ............... G01R 31/2886 |
| | | | | 117/100 |
| 2009/0173448 | A1 | | 7/2009 | Fujii et al. |
| 2011/0061919 | A1 | * | 3/2011 | Hwang ............... H01L 23/4006 |
| | | | | 29/832 |
| 2013/0043064 | A1 | * | 2/2013 | Hwang ................ H05K 1/0203 |
| | | | | 174/252 |
| 2013/0087813 | A1 | * | 4/2013 | Yan ........................ H01L 33/62 |
| | | | | 257/E33.012 |

FOREIGN PATENT DOCUMENTS

| JP | 2009-188389 | 8/2009 |
| JP | 2019-212668 | 12/2019 |
| WO | WO 2019/114968 | * 6/2019 |

* cited by examiner

*Primary Examiner* — Timothy J Thompson
*Assistant Examiner* — Michael F McAllister
(74) *Attorney, Agent, or Firm* — Rankin, Hill & Clark LLP (57) ABSTRACT

A columnar metal component includes a first main surface, and a second main surface on an opposite side to the first main surface. The first main surface includes a first groove. The metal component includes a through-hole penetrating the metal component from the first main surface to the second main surface.

13 Claims, 10 Drawing Sheets

METAL COMPONENT AND CERAMIC SUBSTRATE

CROSS-REFERENCE TO RELATED APPLICATIONS

This application is based on and claims the benefit of priority from prior Japanese patent application No. 2021-180087 filed on Nov. 4, 2021, the entire contents of which are incorporated herein by reference.

TECHNICAL FIELD

The present disclosure relates to a metal component and a ceramic substrate.

BACKGROUND ART

A ceramic substrate including a conductive layer is suggested. In some cases, a metal component is bonded to the conductive layer by using a solder material, through an opening portion formed in the ceramic substrate.

CITATION LIST

Patent Literature

Patent Literature 1: JP2019-212668A
Patent Literature 2: JP2009-188389A

SUMMARY OF INVENTION

When the metal component is bonded to a conductive part located in the opening portion of the substrate by using the solder material, the flux contained in the solder is in a state in which it is difficult to volatilize, resulting in a bonding layer containing many voids in the solder, which lowers bonding reliability. In particular, in long-term use under high-temperature environment of 200° C. or higher, the bonding reliability is deteriorated due to fatigue of the solder.

An object of the present disclosure is to provide a metal component and a ceramic substrate capable of improving bonding reliability under high-temperature environment.

According to one aspect of the present disclosure, a columnar metal component comprises:
 a first main surface; and
 a second main surface on an opposite side to the first main surface,
 wherein the first main surface includes a first groove, and
 wherein the metal component includes a through-hole penetrating the metal component from the first main surface to the second main surface.

According to the present disclosure, it is possible to improve bonding reliability under high-temperature environment.

DESCRIPTION OF EMBODIMENTS

Hereinafter, embodiments of the present disclosure will be specifically described with reference to the accompanying drawings. Note that, in the specification and drawings, the constitutional elements having substantially the same functional configurations are denoted with the same reference signs, and the overlapping descriptions may be omitted. In addition, in the present disclosure, the X1-X2 direction, the Y1-Y2 direction, and the Z1-Z2 direction are defined as directions orthogonal to each other. The plane including the X1-X2 direction and the Y1-Y2 direction is described as the XY plane, the plane including the Y1-Y2 direction and the Z1-Z2 direction is described as the YZ plane, and the plane including the Z1-Z2 direction and the X1-X2 direction is described as the ZX plane. Note that, for convenience, the Z1-Z2 direction is defined as the upper and lower direction, the Z1 side is defined as the upper side, and the Z2 side is defined as the lower side. In addition, 'in atop view' means seeing a target object from the Z1 side, and 'planar shape' means a shape of a target object as seen from the Z1 side. However, the metal component and the ceramic substrate can be used in inverted states, or can be arranged at an arbitrary angle.

First Embodiment

Figure 1:
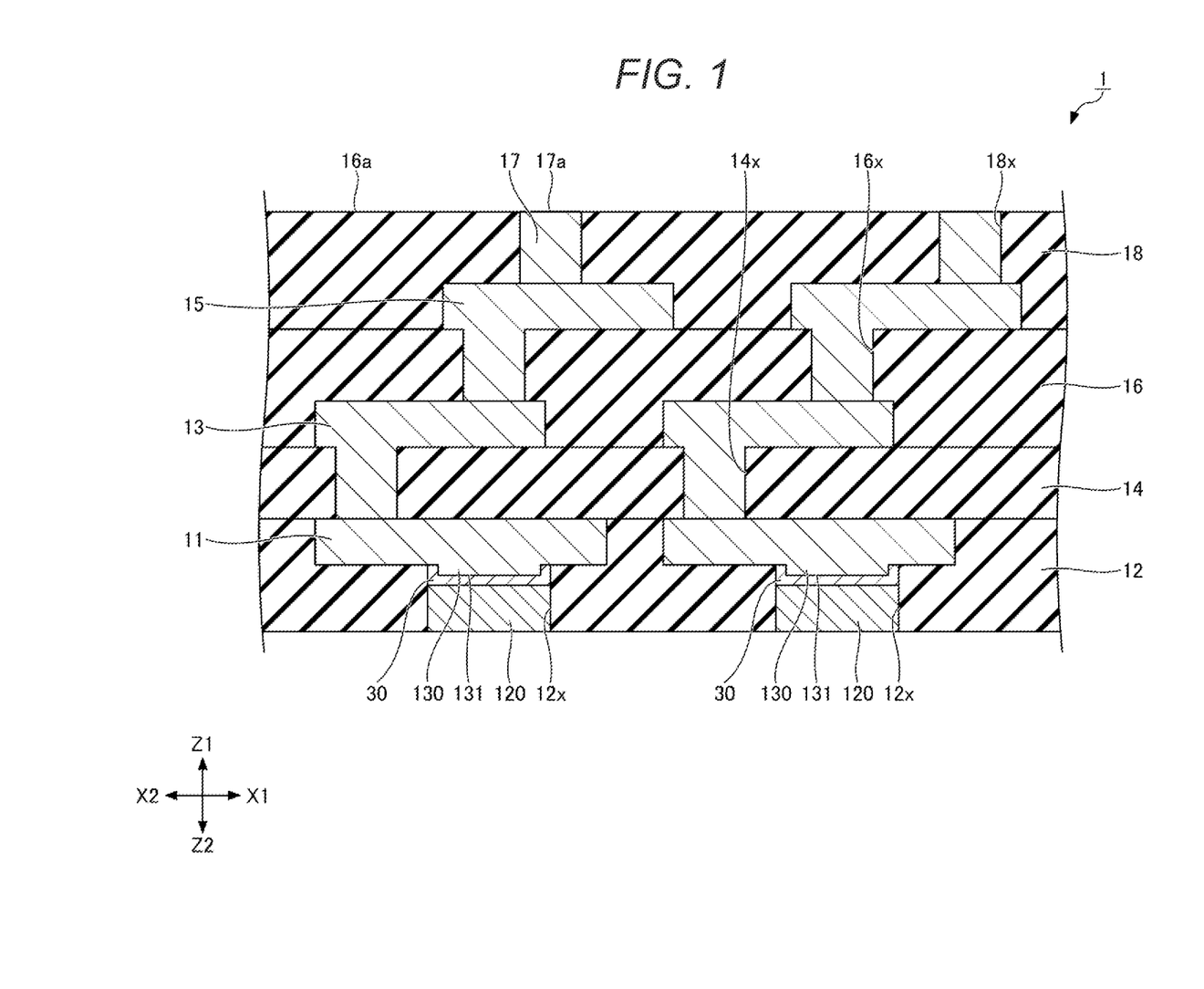
FIG. 1 is a cross-sectional view showing an outline of a ceramic substrate according to a first embodiment.

First of all, a first embodiment will be described. The first embodiment relates to a ceramic substrate.
[Outline of Configuration of Ceramic Substrate]
First, an outline of a ceramic substrate according to the first embodiment will be described. FIG. 1 is a cross-sectional view showing an outline of a ceramic substrate according to the first embodiment. As shown in FIG. 1, a ceramic substrate 1 includes a first wiring layer 11, a first ceramic layer 12, a second wiring layer 13, a second ceramic layer 14, a third wiring layer 15, a third ceramic layer 16, an electrode 17 and a fourth ceramic layer 18. The first ceramic layer 12, the second ceramic layer 14, the third ceramic layer 16, and the fourth ceramic layer 18 constitute a ceramic insulating base material.

The first wiring layer 11 is formed on one surface (surface on the Z2 side) of the second ceramic layer 14. As a material of the first wiring layer 11, tungsten (W) may be used, for example. As the material of the first wiring layer 11, molybdenum (Mo) or the like may also be used. A thickness of the first wiring layer 11 may be set to about 5 μm, for example. The first wiring layer 11 is an example of the conductive layer.

As a material of the second ceramic layer 14, for example, sodium oxide ($Na_2O$), aluminum oxide ($Al_2O_3$), boron oxide ($B_2O_3$), silicon dioxide ($SiO_2$) or the like can be used. A thickness of the second wiring layer 14 may be set to about 10 μm, for example.

The second ceramic layer 14 is formed with a first via hole 14*x* for exposing an upper surface (surface on the Z1 side) of the first wiring layer 11. The first via hole 14*x* is formed to penetrate through the second ceramic layer 14.

The second wiring layer 13 is formed on the other surface (surface on the Z1 side) of the second ceramic layer 14. The second wiring layer 13 includes a via fill filled in the first via hole 14*x* and a wiring pattern formed on the second ceramic layer 14. The second wiring layer 13 is electrically connected to the first wiring layer 11 exposed into the first via hole 14*x*. A thickness of the wiring pattern constituting the second wiring layer 13 may be set to about 5 μm, for example.

The third ceramic layer 16 is formed on the second ceramic layer 14 so as to cover the second wiring layer 13. As a material of the third ceramic layer 16, for example, sodium oxide ($Na_2O$), aluminum oxide ($Al_2O_3$), boron oxide ($B_2O_3$), silicon dioxide ($SiO_2$) or the like can be used. A thickness of the third wiring layer 16 may be set to about 10 μm, for example. The third ceramic layer 16 is formed with a second via hole 16*x* for exposing an upper surface (surface on the Z1 side) of the second wiring layer 13. The second via hole 16*x* is formed to penetrate through the third ceramic layer 16.

The third wiring layer 15 is formed on the third ceramic layer 16. The third wiring layer 15 includes a via fill filled in the second via hole 16*x* and a wiring pattern formed on the third ceramic layer 16. The third wiring layer 15 is electrically connected to the second wiring layer 13 exposed into the second via hole 16*x*. A thickness of the wiring pattern constituting the third wiring layer 15 may be set to about 5 μm, for example.

The fourth ceramic layer 18 is formed on the third ceramic layer 16 so as to cover the third wiring layer 15. As a material of the fourth ceramic layer 18, for example, sodium oxide ($Na_2O$), aluminum oxide ($Al_2O_3$), boron oxide ($B_2O_3$), silicon dioxide ($SiO_2$) or the like can be used. A thickness of the fourth wiring layer 18 may be set to about 10 μm, for example. The fourth ceramic layer 18 is formed with a third via hole 18*x* for exposing an upper surface (surface on the Z1 side) of the third wiring layer 15. The third via hole 18*x* is formed to penetrate through the fourth ceramic layer 18.

The electrode 17 includes a via fill filled in the third via hole 18*x*. A surface 17*a* of the electrode 17 on the Z1 side is substantially flush with a surface 16*a* of the fourth ceramic layer 18 on the Z1 side. That is, the surface 17*a* of the electrode 17 is exposed from the surface 16*a* of the fourth ceramic layer 18. The electrode 17 is electrically connected to the third wiring layer 15 exposed into the third via hole 18*x*. A thickness of the electrode 17 may be set to about 5 μm, for example.

The first ceramic layer 12 is formed on one surface (surface on the Z2 side) of the second ceramic layer 14 so as to cover the first wiring layer 11. The first ceramic layer 12 is formed with an opening portion 12*x*, and a part of the first wiring layer 11 is exposed into the opening portion 12*x* of the first ceramic layer 12. As a material of the first ceramic layer 12, for example, sodium oxide ($Na_2O$), aluminum oxide ($Al_2O_3$), boron oxide ($B_2O_3$), silicon dioxide ($SiO_2$) or the like can be used. A thickness of the first wiring layer 12 may be set to about 15 μm, for example. The first ceramic layer 12 is an example of the insulating layer.

A metal component 120 is provided on an inner side of the opening portion 12*x*. The metal component 120 is bonded to the first wiring layer 11 by a solder bonding layer 30. The solder bonding layer 30 preferably has a melting point of 250° C. or higher and a low coefficient of thermal expansion. A composition of the solder bonding layer 30 is preferably Au—Sn, Sn—Sb, Sn—Cu, Sn—Bi, or those obtained by adding Ag, Ge, Sb, Ni or the like to the same.

[Composition of Metal Component]

Figure 2:
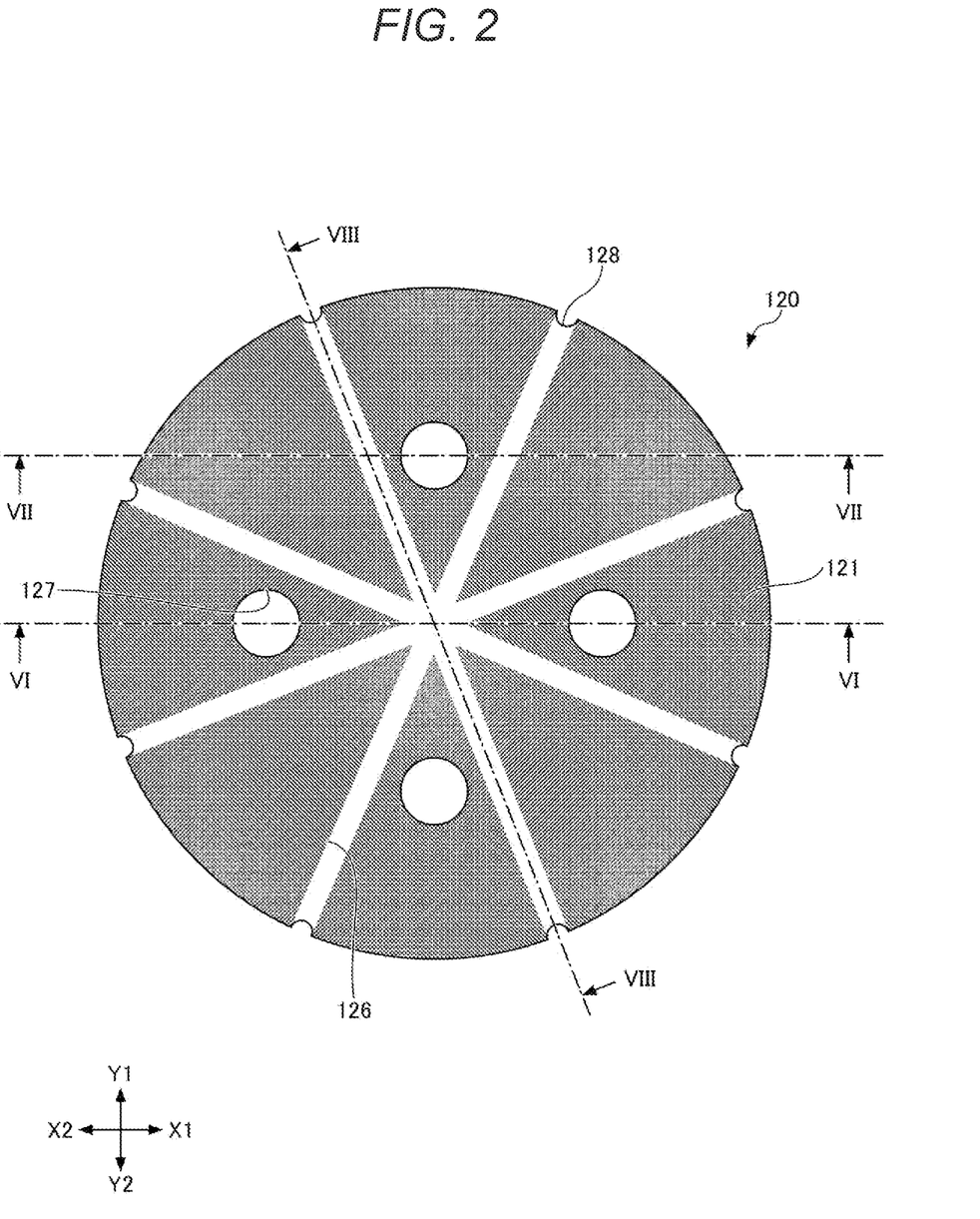
FIG. 2 is a top view showing a metal component in the first embodiment.
Figure 3:
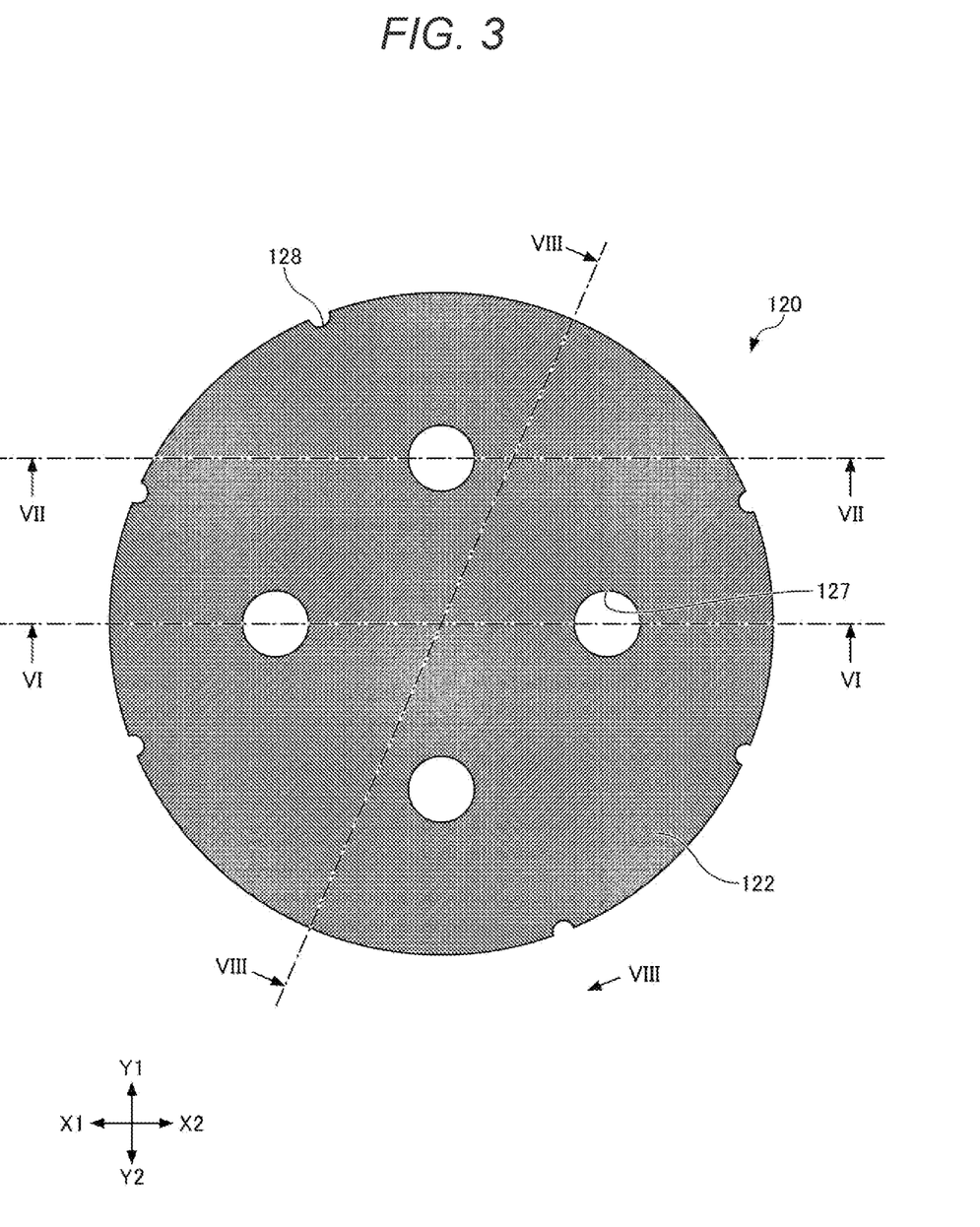
FIG. 3 is a bottom view showing the metal component in the first embodiment.
Figure 4:
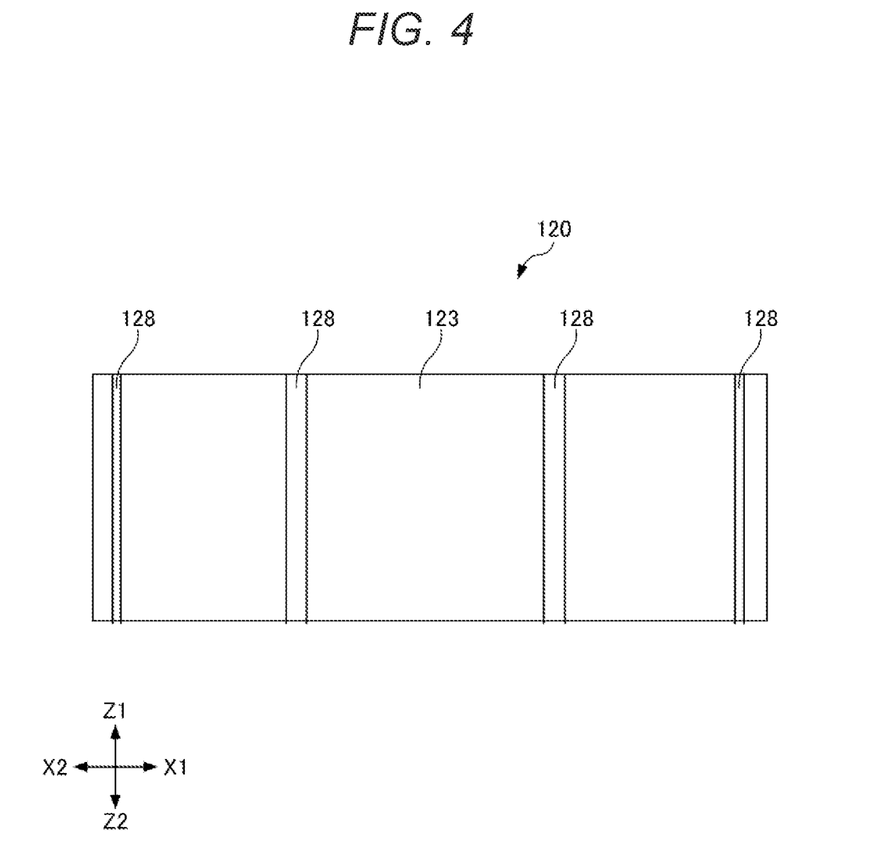
FIG. 4 is a front view showing the metal component in the first embodiment.

Next, a configuration of the metal component 120 will be described. FIG. 2 is a top view showing a metal component in the first embodiment. FIG. 3 is a bottom view showing the metal component in the first embodiment. FIG. 4 is a front view showing the metal component in the first embodiment.

As shown in FIGS. 2 to 4, the metal component 120 in the first embodiment has a cylindrical shape. The metal component 120 has a first main surface 121, a second main surface 122 on an opposite side to the first main surface 121, and a side surface 123.

The first main surface 121 is formed with a plurality of first grooves 126 each extending radially from a center to an outer edge. In FIG. 2, eight first grooves 126 are formed at intervals of 45 degrees in a circumferential direction, for example. However, the number of the first grooves 126 formed on the first main surface 121 is not limited to eight. The number of the first grooves 126 may be less than eight, or more than eight, but at least four first grooves 126 are formed at intervals of 90 degrees in the circumferential direction. For example, a depth of the first groove 126 is 50 μm to 100 μm, and a width thereof is 100 μm to 300 μm.

The metal component 120 is formed with a plurality of through-holes 127 penetrating the metal component 120 from the first main surface 121 to the second main surface 122. In the first main surface 121, the positions of the first grooves 126 and the through-holes 127 are misaligned to each other. In other words, the positions of the first grooves 126 and the through-holes 127 do not overlap each other. A total of four through-holes 127 are formed at intervals of 90 degrees in the circumferential direction, for example. For example, a diameter of the through-hole 127 is 100 μm to 300 μm.

The side surface 123 is formed with a plurality of second grooves 128. The plurality of second grooves 128 connects to the first main surface 121 and the second main surface 122. In other words, the side surface 123 connects the first main surface 121 and the second main surface 122, and the plurality of second grooves 128 extend from the first main surface 121 to the second main surface 122. A total of eight second grooves 128 are formed at intervals of 45 degrees in the circumferential direction, for example. Each of the second grooves 128 connects to the first groove 126 in the first main surface 121. For example, a depth of the second groove 128 is 50 μm to 100 μm, and a width thereof is 100 μm to 300 μm.

A diameter of the metal component 120 is smaller than a diameter of the opening portion 12*x*. There is a gap 143 between the metal component 120 and an inner wall surface of the opening portion 12*x* (refer to FIGS. 6 and 7).

[Configuration of First Wiring Layer]

Figure 5:
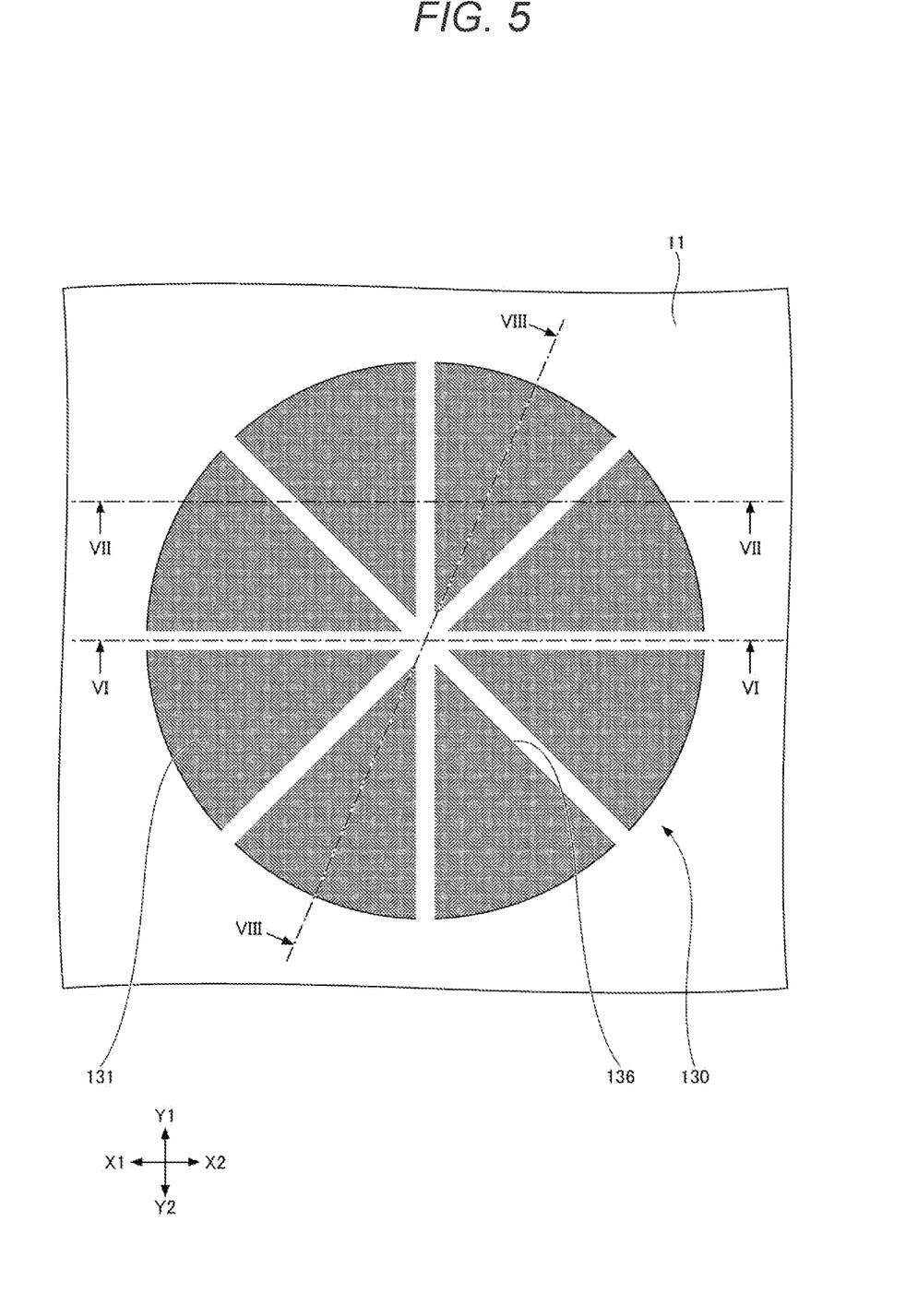
FIG. 5 is a bottom view showing a first wiring layer.

Next, a configuration of the first wiring layer 11 will be described. FIG. 5 is a bottom view showing the first wiring layer.

As shown in FIG. 5, the first wiring layer 11 has a convex portion 130 protruding into the opening portion 12*x*. The convex portion 130 has a cylindrical shape. For example, a height of the convex portion 130 is 50 μm to 100 μm. A diameter of the convex portion 130 is smaller than the diameter of the opening portion 12x, and a gap 142 exists between the convex portion 130 and the inner wall surface of the opening portion 12x (refer to FIGS. 7 and 8). For example, a size of the gap 142 is 50 μm to 100 μm. The gap 142 is an example of the second gap. On the convex portion 130, for example, nickel plating or gold plating on nickel plating is preferably performed.

A surface 131 of the convex portion 130 on the Z2 side is formed with a plurality of third grooves 136 extending radially from a center to an outer edge. A total of eight third grooves 136 are formed at intervals of 45 degrees in the circumferential direction, for example. For example, a depth of the third groove 136 is 50 μm to 100 μm, and a width thereof is 100 μm to 300 μm.

[Bonding Structure Between First Wiring Layer and Metal Component]

Figure 6:
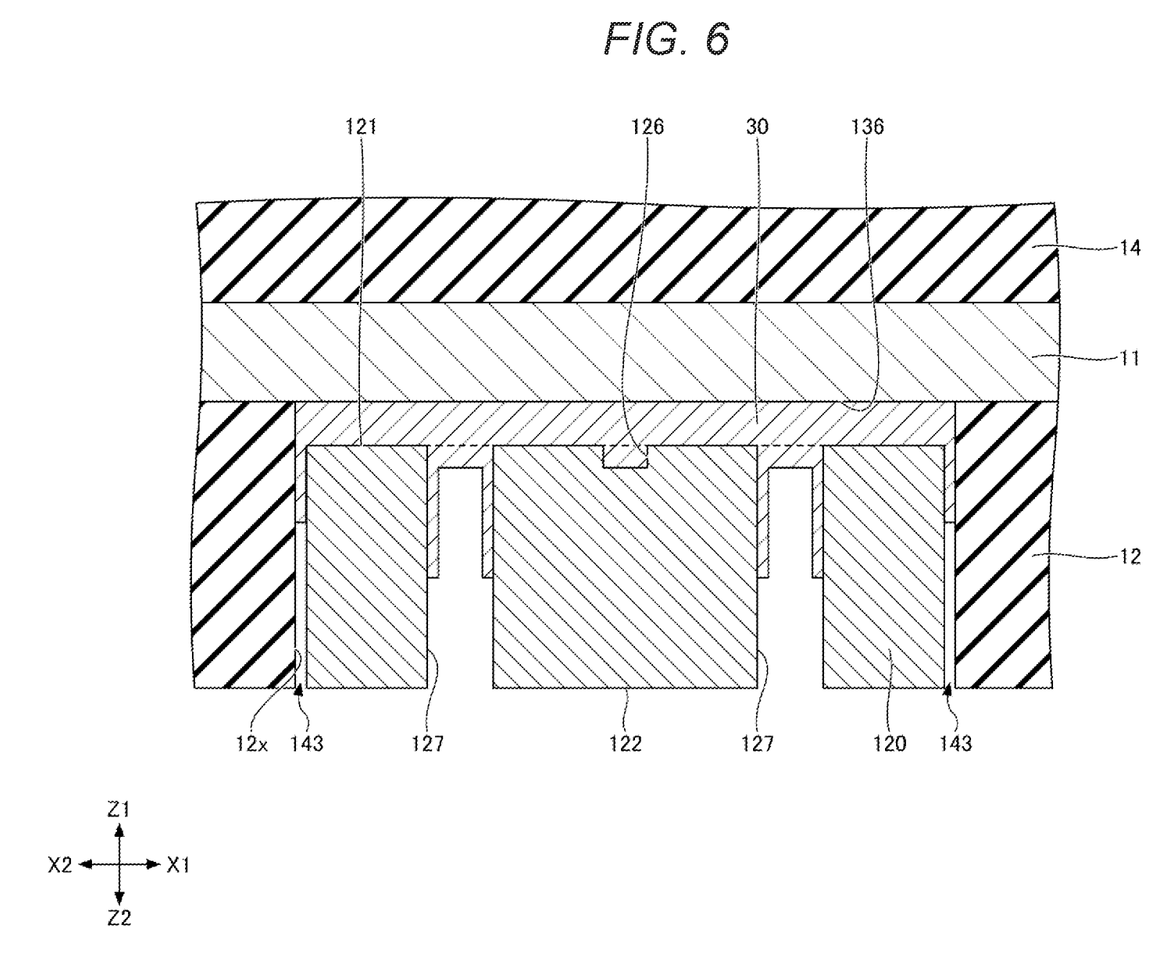
FIG. 6 is a cross-sectional view showing a bonding structure between the first wiring layer and the metal component in the first embodiment.
Figure 7:
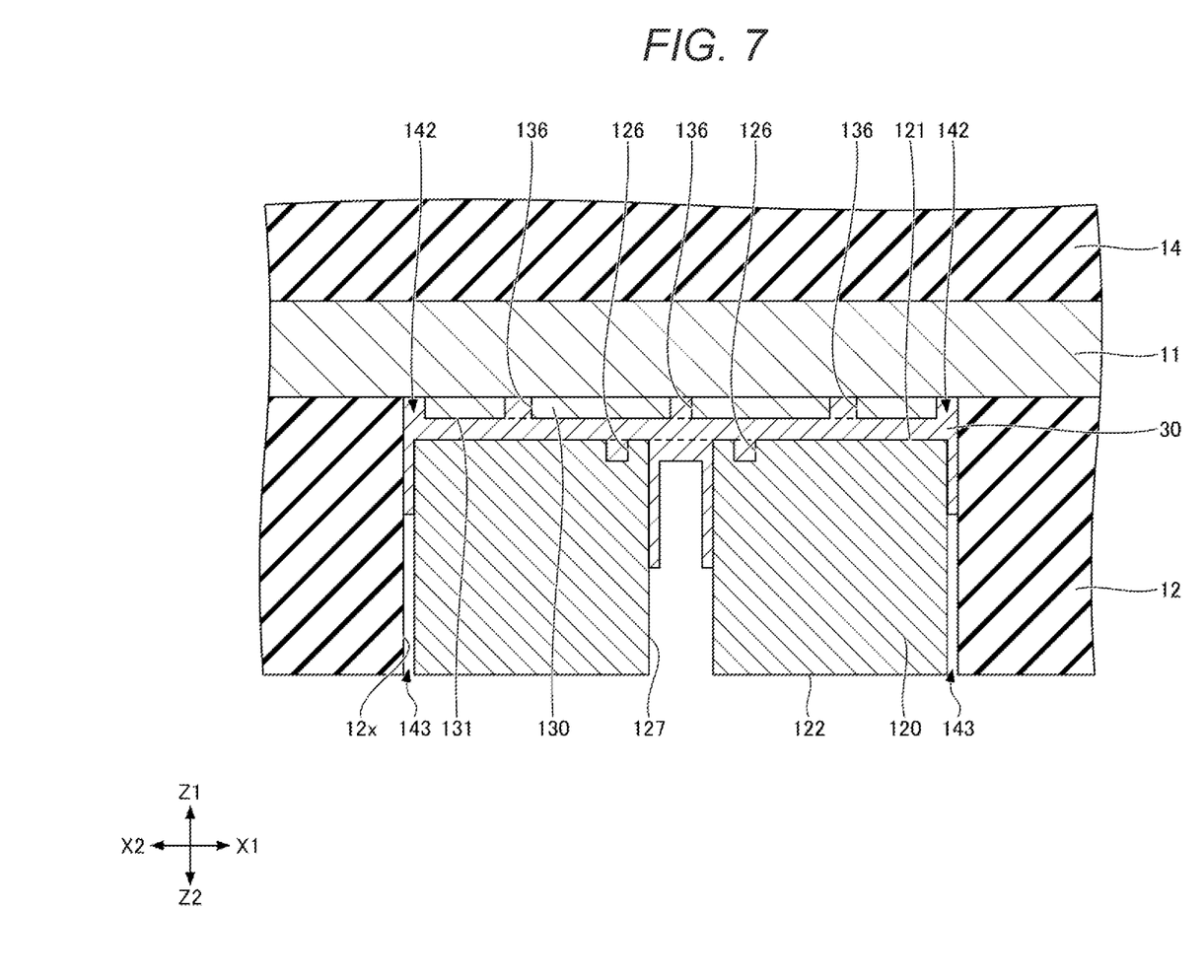
FIG. 7 is a cross-sectional view showing the bonding structure between the first wiring layer and the metal component in the first embodiment.
Figure 8:
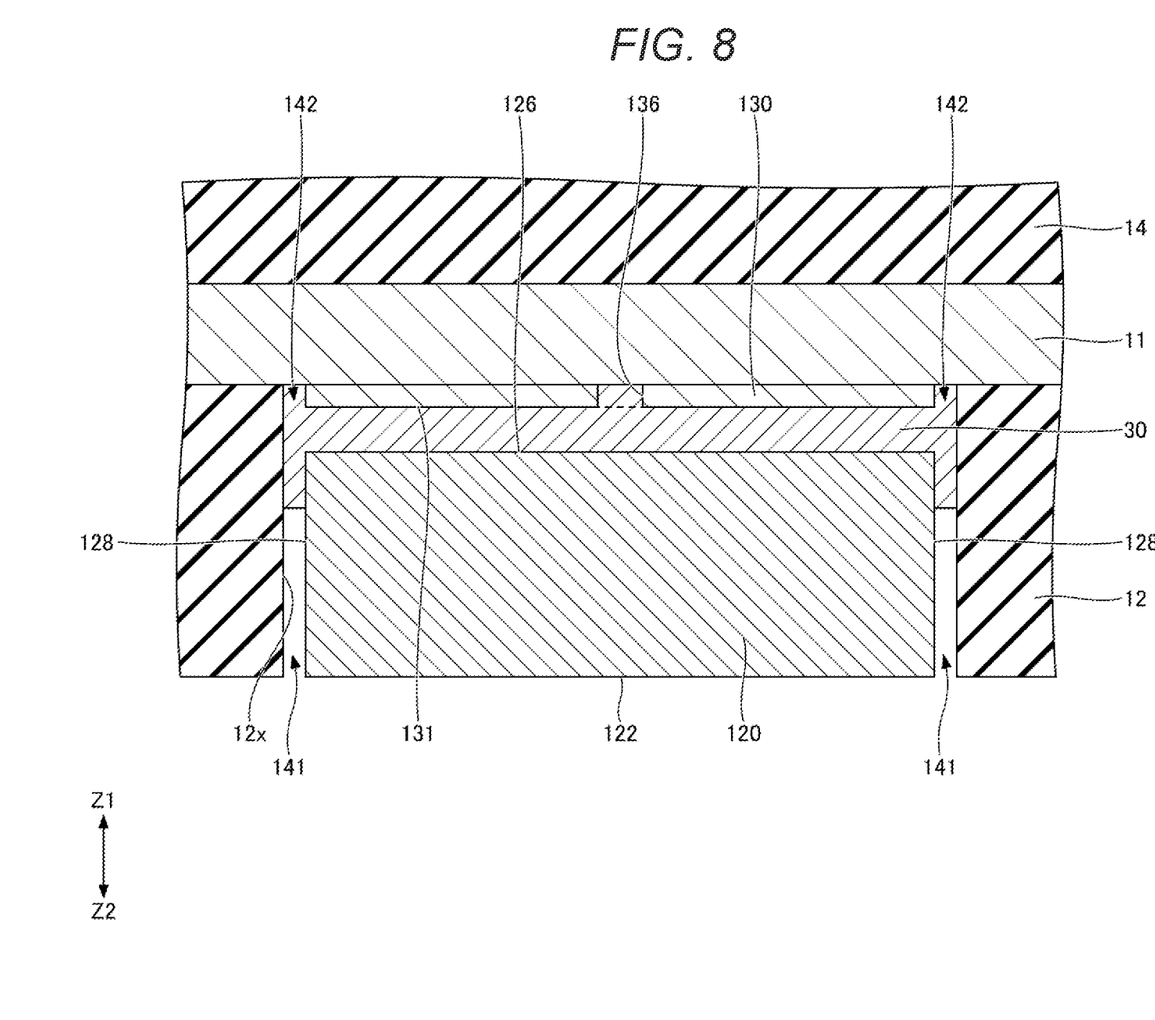
FIG. 8 is a cross-sectional view showing the bonding structure between the first wiring layer and the metal component in the first embodiment.

Next, a bonding structure between the first wiring layer 11 and the metal component 120 will be described. FIGS. 6 to 8 are cross-sectional views showing a bonding structure between the first wiring layer 11 and the metal component 120. FIG. 6 corresponds to a cross-sectional view taken along a line VI-VI in FIGS. 2, 3 and 5. FIG. 7 corresponds to a cross-sectional view taken along a line VII-VII in FIGS. 2, 3 and 5. FIG. 8 corresponds to a cross-sectional view taken along a line VIII-VIII in FIGS. 2, 3 and 5.

As shown in FIGS. 6 to 8, the metal component 120 is inserted in the opening portion 12x so that the first main surface 121 faces the surface 131 of the convex portion 130. For example, in the top view, the through-hole 127 of the metal component 120 and the third groove 136 of the convex portion 130 may overlap each other. The solder bonding layer 30 is provided between the first main surface 121 and the surface 131.

As shown in FIGS. 6 and 7, the gap 143 exists between the metal component 120 and the inner wall surface of the opening portion 12x. In addition, as shown in FIG. 8, in the portion in which the second groove 128 is formed, a gap 141 larger than the gap 143 exists between the metal component 120 and the inner wall surface of the opening portion 12x. The gap 141 is an example of the first gap.

When bonding the metal component 120 to the first wiring layer 11, a solder material serving as the solder bonding layer 30 is disposed between the first wiring layer 11 and the metal component 120, the solder material is melted by heating, and thereafter, the solder bonding layer 30 is formed by cooling. The solder material contains flux, and when melted, the flux volatilizes. In the present embodiment, the volatilized flux is discharged to an outside of the opening portion 12x through, for example, the third groove 136 and the through-hole 127, and is also discharged to the outside of the opening portion 12x through the first groove 126 or third groove 136 and the second groove 128. For this reason, it is difficult for a void to exist in the solder bonding layer 30. That is, according to the present embodiment, it is possible to reduce voids in the solder bonding layer.

In addition, the molten solder material gathers between the first main surface 121 and the surface 131, and also flows into the gap 141, the gap 142, and the through-hole 127. For this reason, while a large contact area can be obtained between the solder bonding layer and the first wiring layer 11, a large contact area can also be obtained between the solder bonding layer 30 and the metal component 120. Therefore, it is possible to obtain an excellent anchor effect.

Further, a thickness (dimension in the Z1-Z2 direction) of the solder bonding layer is not uniform within a plane parallel to the XY plane. For example, thicknesses are different from each other among a portion positioned between the first main surface 121 and the surface 131, a portion slotted into the third groove 136, and a portion slotted into the first groove 126. In general, when used at a high temperature of 200° C. or higher, an intermetallic compound may grow with aging change and the like in the solder bonding layer, and a fatigue failure may occur in the solder bonding layer with the growth of the intermetallic compound. On the other hand, in the present embodiment, since the thickness of the solder bonding layer is not uniform, the fatigue failure of the solder bonding layer 30 with growth of the intermetallic compound can be suppressed.

In this way, according to the first embodiment, it is possible to improve bonding reliability.

For example, power may be supplied to the first wiring layer 11 via the metal component 120.

Second Embodiment

Figure 9:
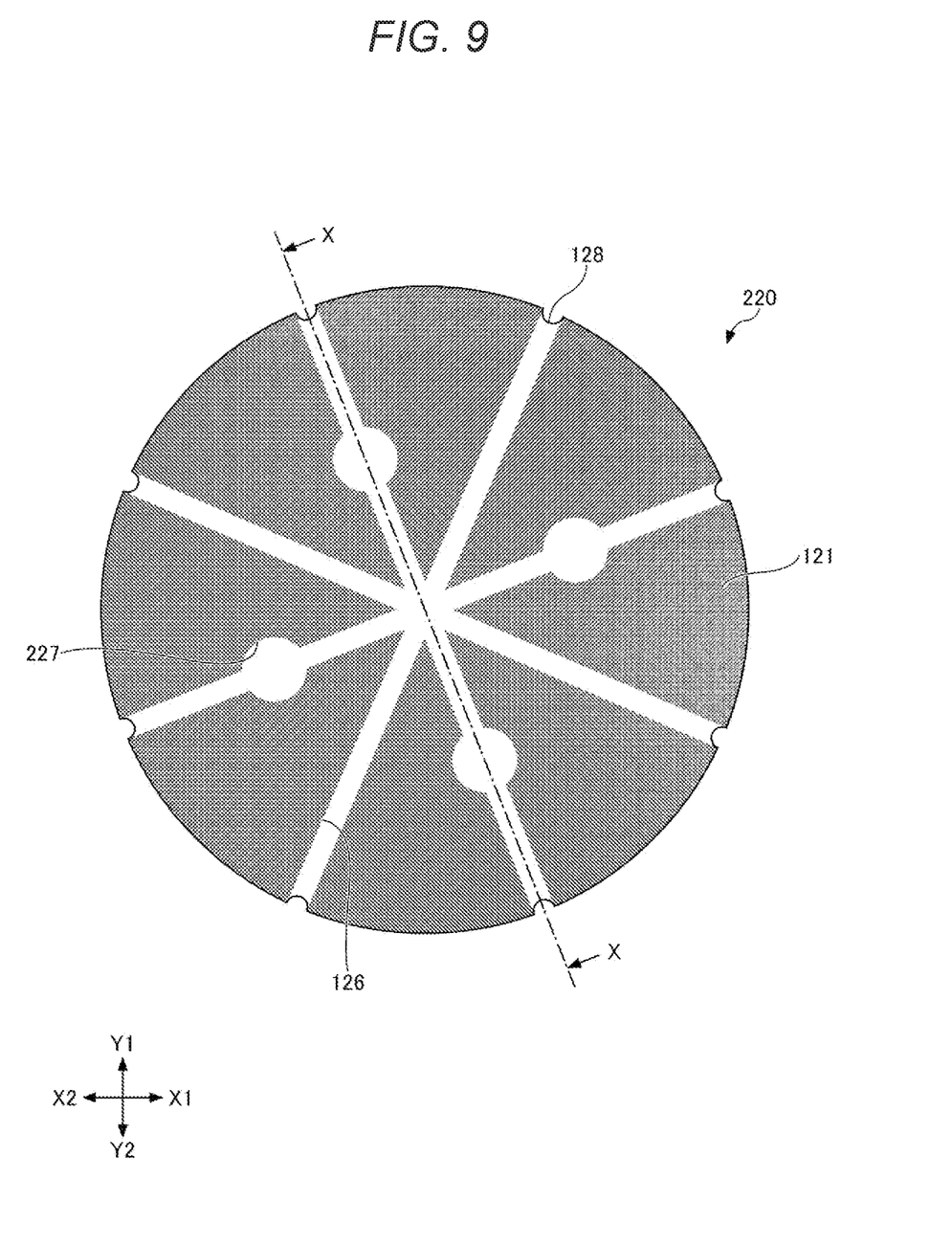
FIG. 9 is a top view showing a metal component in a second embodiment.

Next, a second embodiment will be described. The second embodiment is different from the first embodiment, in terms of the configuration of the metal component. FIG. 9 is a top view showing a metal component in the second embodiment.

In the second embodiment, a metal component 220 is provided on an inner side of the opening portion 12x, instead of the metal component 120. The metal component 220 is bonded to the first wiring layer 11 by the solder bonding layer 30.

The metal component 220 is formed with a plurality of through-holes 227 penetrating from the first main surface 121 to the second main surface 122, instead of the through-holes 127. In the first main surface 121, positions of the first groove 126 and the through-hole 227 overlap each other. A total of four through-holes 227 are formed at intervals of 90 degrees in the circumferential direction, for example. For example, a diameter of the through-hole 227 is 100 μm to 300 μm.

The other configurations of the metal component 220 are similar to those of the metal component 120.

Figure 10:
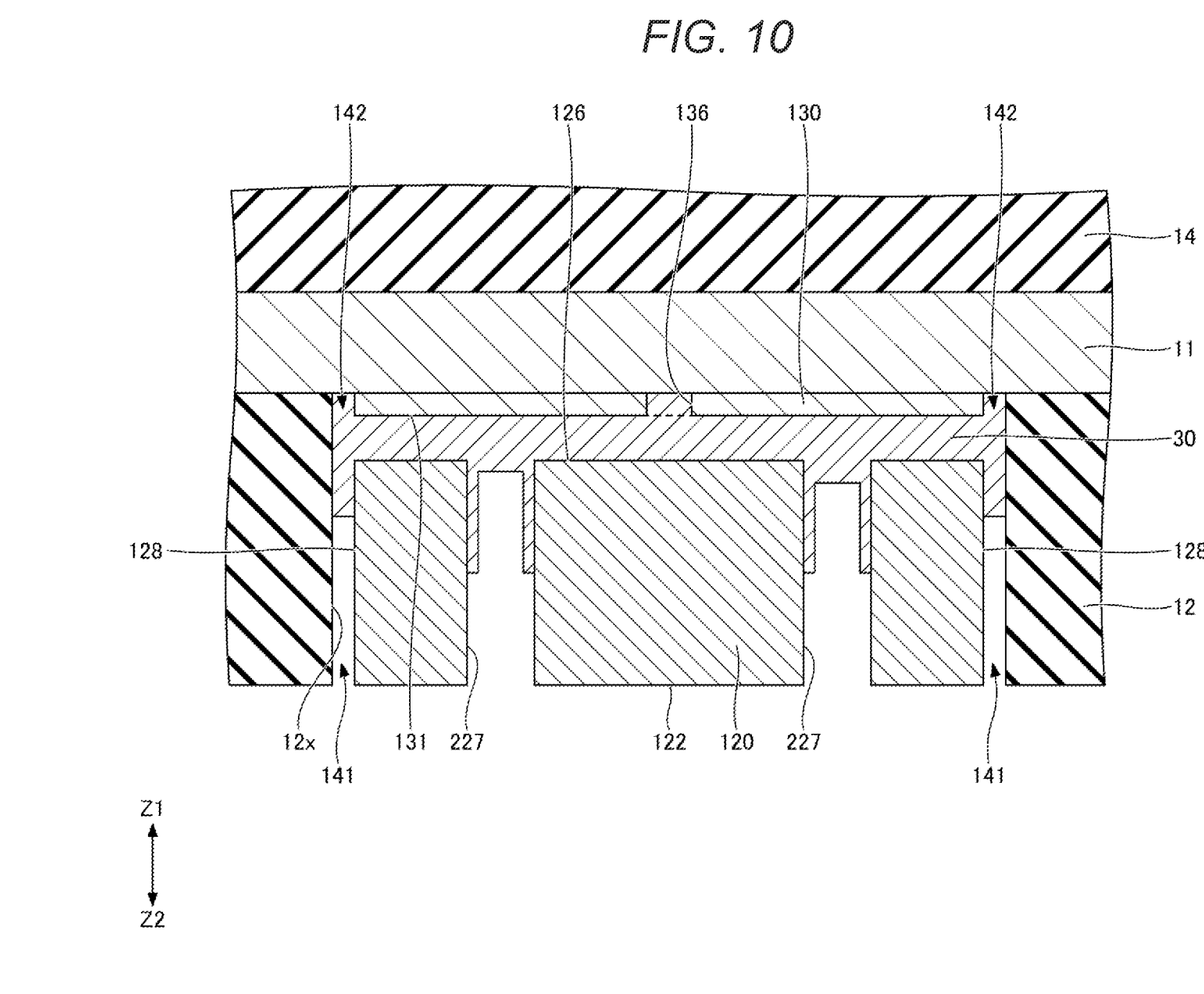
FIG. 10 is a cross-sectional view showing a bonding structure between the first wiring layer and the metal component in the second embodiment.

Next, a bonding structure between the first wiring layer 11 and the metal component 220 will be described. FIG. 10 is a cross-sectional view showing a bonding structure between the first wiring layer 11 and the metal component 220. FIG. 10 corresponds to a cross-sectional view taken along a line X-X in FIG. 9.

As shown in FIG. 10, the metal component 220 is inserted in the opening portion part 12x so that the first main surface 121 faces the surface 131 of the convex portion 130. For example, in the top view, the through-hole 227 of the metal component 220 and the third groove 136 of the convex portion 130 may deviate from each other in the circumferential direction.

The other configurations are similar to those of the first embodiment.

When bonding the metal component 220 to the first wiring layer 11, a solder material serving as the solder bonding layer 30 is disposed between the first wiring layer 11 and the metal component 220, the solder material is melted by heating, and thereafter, the solder bonding layer 30 is formed by cooling. The solder material contains flux, and when melted, the flux volatilizes. In the present embodiment, the volatilized flux is discharged to the outside of the opening portion 12x through, for example, the first groove 126 and the through-hole 227, and is also discharged to the outside of the opening portion 12x through the first groove 126 or third groove 136 and the second groove 128.

Therefore, also in the second embodiment, it is possible to improve the bonding reliability, similar to the first embodiment.

Note that, in the present disclosure, the planar shape of the ceramic substrate is not particularly limited. For example, the planar shape of the ceramic substrate may be a rectangular shape or a circular shape.

The material of the metal component is not particularly limited, and, for example, a material in which nickel plating has been implemented on a base material of a tungsten-copper alloy may be used.

In addition, the shape of the metal component is not limited to the cylindrical shape, and may be a polygonal column shape or the like.

Although the preferred embodiments and the like have been described in detail, the present disclosure is not limited to the above-described embodiments and the like, and a variety of changes and replacements can be made for the above-described embodiments and the like without departing from the scope defined in the claims.

What is claimed is:

1. A columnar metal component comprising:
   a first main surface; and
   a second main surface on an opposite side to the first main surface,
   wherein the first main surface includes a first groove,
   wherein the columnar metal component includes a through-hole penetrating the columnar metal component from the first main surface to the second main surface, and
   wherein in the first main surface, positions of the first groove and the through-hole are misaligned to each other.

2. The columnar metal component according to claim 1, further comprising:
   a side surface including a second groove connecting to the first main surface and the second main surface.

3. The columnar metal component according to claim 2, wherein the first groove and the second groove are connected.

4. The columnar metal component according to claim 1, wherein a plurality of the first groove extend radially from a center to an outer edge on the first main surface.

5. A ceramic substrate comprising:
   a ceramic insulating base material;
   a conductive layer provided on one surface of the ceramic insulating base material;
   an insulating layer provided on the one surface of the ceramic insulating base material and covering the conductive layer, the insulating layer including an opening portion for exposing a part of the conductive layer;
   a columnar metal component disposed in the opening portion, the columnar metal component comprising:
      a first main surface including a first groove; and
      a second main surface on an opposite side to the first main surface,
      wherein the columnar metal component includes a through-hole penetrating the columnar metal component from the first main surface to the second main surface; and,
   a solder bonding layer bonding the first main surface of the metal component to the conductive layer.

6. The ceramic substrate according to claim 5, wherein a first gap exists between the columnar metal component and an inner wall surface of the opening portion.

7. The ceramic substrate according to claim 5, wherein the conductive layer has a convex portion protruding into the opening portion, and
   wherein a second gap exists between the convex portion and an inner wall surface of the opening portion.

8. The ceramic substrate according to claim 7, wherein the convex portion includes a third groove formed in a surface of the convex portion facing the columnar metal component.

9. The ceramic substrate according to claim 5, further comprising:
   a side surface including a second groove connecting to the first main surface and the second main surface.

10. The ceramic substrate according to claim 9, wherein the first groove and the second groove are connected.

11. The ceramic substrate according to claim 5, wherein in the first main surface, positions of the first groove and the through-hole are misaligned to each other.

12. The ceramic substrate according to claim 5, wherein in the first main surface, positions of the first groove and the through-hole overlap each other.

13. The ceramic substrate according to claim 5, wherein a plurality of the first groove extend radially from a center to an outer edge on the first main surface.

* * * * *